(12) United States Patent
Joppich-Dohlus et al.

(10) Patent No.: US 11,425,473 B2
(45) Date of Patent: *Aug. 23, 2022

(54) METHOD FOR COLLECTING DATA AND SENSOR, DATA COLLECTOR AND MEASUREMENT DATA INFORMATION NETWORK

(71) Applicants: DIEHL METERING SYSTEMS GMBH, Nuremberg (DE); DIEHL METERING S.A.S, Saint Louis (FR)

(72) Inventors: Petra Joppich-Dohlus, Rathsberg (DE); Thomas Kauppert, Nuremberg (DE); Achim Schmidt, Weissenohe (DE); Stefan Schmitz, Nuremberg (DE); Christoph Sosna, Nuremberg (DE); Klaus Gottschalk, Winkelhaid (DE); Guy Bach, Waldighoffen (FR); Aster Breton, Mullhouse (FR)

(73) Assignees: Diehl Metering Systems GmbH, Nuremberg (DE); Diehl Metering S.A.S., Saint Louis (FR)

(*) Notice: Subject to any disclaimer, the term of this patent is extended or adjusted under 35 U.S.C. 154(b) by 105 days.

This patent is subject to a terminal disclaimer.

(21) Appl. No.: 16/715,060

(22) Filed: Dec. 16, 2019

(65) Prior Publication Data
US 2020/0196031 A1  Jun. 18, 2020

(30) Foreign Application Priority Data

Dec. 14, 2018 (DE) .......................... 102018009821

(51) Int. Cl.
*G01D 4/00* (2006.01)
*H04W 4/38* (2018.01)
(Continued)

(52) U.S. Cl.
CPC .............. *H04Q 9/02* (2013.01); *G01D 4/002* (2013.01); *G01R 21/007* (2013.01); *H04W 4/38* (2018.02);
(Continued)

(58) Field of Classification Search
None
See application file for complete search history.

(56) References Cited

U.S. PATENT DOCUMENTS 8,949,055 B2   2/2015  Hampel et al.
11,162,813 B2 * 11/2021 Sosna .................... G01D 4/002
(Continued)

FOREIGN PATENT DOCUMENTS

DE  102008058264 A1   7/2010
DE  102016007287 A1  12/2017
EP       2449705 B1   4/2013

*Primary Examiner* — Curtis A Kuntz
*Assistant Examiner* — Jerold B Murphy
(74) *Attorney, Agent, or Firm* — Laurence A. Greenberg; Werner H. Stemer; Ralph E. Locher

(57) ABSTRACT

A method collects data via a sensor being part of a supply network which distributes a consumable. The sensor contains a measuring element which provides elementary measuring units, which correspond to a variable or a parameter, as raw measurement data, where consumption data are generated from the elementary measuring units. The sensor has a communication device and a storage device. To determine the measurement resolution of the sensor, the conditions for generating time stamps are determined using a correlation model. Time stamps of successive raw measurement data are generated in the sensor based on the correlation model, the time stamps are transmitted via a wired connection and/or via a radio path, with the result that the raw measurement data acquired by the measuring element are reconstructed and evaluated on the basis of the time stamps using the correlation model. The consumption data are transmitted in parallel with the time stamps.

28 Claims, 11 Drawing Sheets

(51) Int. Cl.
   *H04Q 9/02*         (2006.01)
   *G01R 21/00*        (2006.01)
(52) U.S. Cl.
   CPC . *H04Q 2209/60* (2013.01); *H04Q 2213/1313* (2013.01)

(56) References Cited

U.S. PATENT DOCUMENTS

| | | | | |
|---|---|---|---|---|
| 2003/0067900 | A1* | 4/2003 | Pittock | H04Q 9/04 370/336 |
| 2004/0113812 | A1* | 6/2004 | Bianchi | H04Q 9/00 340/870.02 |
| 2009/0135836 | A1* | 5/2009 | Veillette | G01D 4/004 370/400 |
| 2012/0280832 | A1* | 11/2012 | Jonsson | G01D 4/00 340/870.02 |
| 2013/0300578 | A1* | 11/2013 | Uchida | H04W 4/20 340/870.02 |
| 2016/0103163 | A1* | 4/2016 | Schamber | G01D 9/005 702/61 |
| 2016/0329928 | A1* | 11/2016 | Beroset | H04L 69/04 |
| 2018/0284735 | A1* | 10/2018 | Celia | G05B 23/0221 |
| 2020/0191607 | A1* | 6/2020 | Sosna | G01F 9/001 |
| 2020/0191608 | A1* | 6/2020 | Joppich-Dohlus | G01F 9/001 |
| 2020/0196033 | A1* | 6/2020 | Schmitz | G01D 4/002 |

* cited by examiner

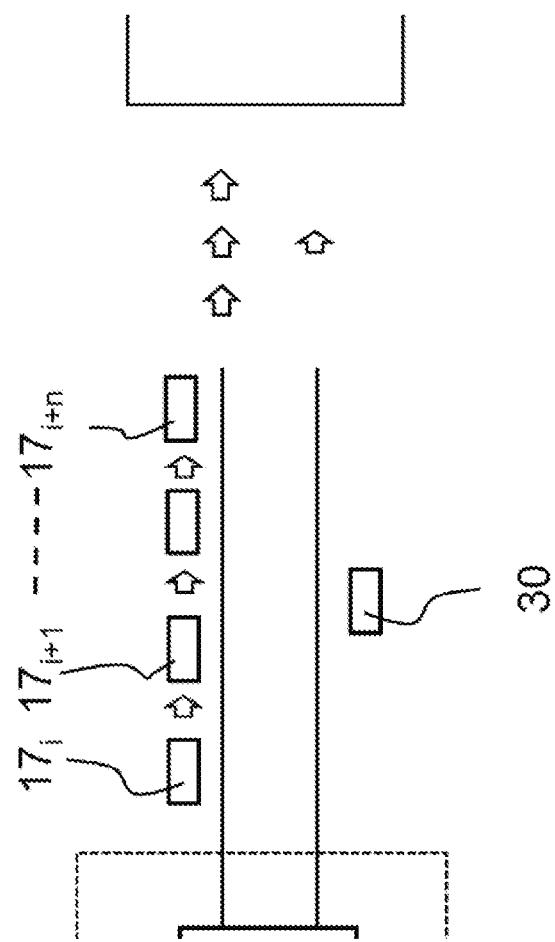

METHOD FOR COLLECTING DATA AND SENSOR, DATA COLLECTOR AND MEASUREMENT DATA INFORMATION NETWORK

CROSS-REFERENCE TO RELATED APPLICATION

This application claims the priority, under 35 U.S.C. § 119, of German application DE 10 2018 009 821.5, filed Dec. 14, 2018; the prior application is herewith incorporated by reference in its entirety.

BACKGROUND OF THE INVENTION

Field of the Invention

The present invention relates, on the one hand, to a method for collecting data according to the independent method claim, to a sensor according to the independent sensor claim, to a data collector according to the independent data collector claim and to a measurement data information network according to the independent network claim.

Consumption meters are part of supply networks for distributing consumables, for example gas, water, heat or electricity, and are used to generate consumption data. Consumption data are calculated by a microprocessor in the meter on the basis of raw measurement data provided by a measuring element of a sensor and are transmitted to a data concentrator via a communication system in the form of a bus system, in particular a so-called M-bus system via radio or wire, i.e. wireless or wired M-bus. The data concentrator forwards the data, via a different system to the M-bus, to a central data management means (head-end system). The data are, in particular, the current consumption, that is to say the meter reading.

In this case, raw measurement data are generated by the measuring element of a sensor in the consumption meter at predetermined predefined times, are evaluated by a microprocessor in the consumption meter, that is to say are converted into consumption data, and the resulting consumption data are then retrieved from the individual locally arranged consumption meters by a reading or receiving device (M-bus master or concentrator or data collector) via a primary communication path at defined times. The consumption data are then transmitted on to a head-end system by the reading or receiving device via a tertiary communication path, for example based on LAN, GPRS, 3G, LTE. The consumption data can then be displayed in the head end or used for invoicing. The previous concept of consumption data acquisition is limited in terms of both its depth of information and its amount of information.

SUMMARY OF THE INVENTION

The object of the present invention is to provide a method of the generic type for collecting and/or forwarding data and a sensor to be used for this purpose, each with increased information content.

The above object is achieved by means of the features of a method for collecting data according to the independent method claim, by means of a sensor according to the independent sensor claim, by means of a data collector according to the independent data collector claim and by means of a measurement data information network according to the independent network claim.

The invention provides a method for collecting data, preferably data in connection with a consumption, a physical or physico-chemical parameter and/or an operating state, during operation of a local sensor, preferably a sensor for a consumption meter, as part of a supply network which contains at least one local sensor, preferably a plurality of local sensors, and is intended to distribute a consumable. The sensor contains a measuring element, the measuring element of the respective sensor provides elementary measuring units, which correspond to at least one physical or physico-chemical variable or at least one physical or physico-chemical parameter, as raw measurement data. Consumption data are generated from the elementary measuring units, and the sensor contains communication means and a storage device. In order to determine the measurement resolution of the sensor, the conditions for generating time stamps are determined in advance using a correlation model, and the time stamps of successive raw measurement data are generated in the sensor on the basis of the correlation model. The time stamps are transmitted via a wired connection and/or via a radio path, with the result that the raw measurement data acquired by the measuring element are reconstructed and evaluated on the basis of the time stamps using the correlation model. The consumption data are transmitted in parallel with the time stamps.

According to the invention, in order to determine the measurement resolution of the sensor, the conditions for generating time stamps are determined in advance using a correlation model. Time stamps of successive raw measurement data are generated in the sensor on the basis of the correlation model and are stored in the storage device. Only the time stamps assigned to the acquired raw measurement data are then transmitted via the primary communication path, with the result that the raw measurement data acquired by the measuring element can be reconstructed again after transmission and can be evaluated on the basis of the time stamps arriving at the master using the correlation model. This dispenses with computationally complex and therefore energy-intensive computing operations in the region of the local sensor. Computationally complex and energy-intensive computing operations can therefore be moved to the region of the master or a head end. The method according to the invention makes it possible to provide time stamps of raw measurement data in a continuous, complete and consistent temporal relationship, that is to say without a gap, in particular in the region of a remote central processing system or a head-end system. The raw measurement data reconstructed from the time stamps can be continuously assigned to the temporal profile, that is to say represent a real-time profile which excludes discontinuous gaps or times in which data are missing. The continuous raw measurement data stream generated in the head end in accordance with the method according to the invention has a much higher resolution over the continuous time axis than previous solutions. In addition to a consumption calculation, for example, the invention makes it possible to carry out a much greater number of calculations and/or determinations and/or functions, including "business" functions, for example in the head-end system, than was previously possible. On account of the method according to the invention, the structure of the sensor can also be considerably simpler and more cost-effective since complex microprocessors for calculations, for example for calculating the flow rate, are dispensed with. On account of the captured temporal relationship of the raw measurement data, manipulations can be avoided since the measurement results can be compared, over their entire temporal profile, with empirical values over the entire time axis. Furthermore, the energy consumption of the subassembly containing the sensor and the time stamp preparation means and/or the communication means is considerably lower than in previous embodiments which locally evaluate the data owing to the fact that energy-intensive computing power is dispensed with. The time stamps may be times or time differences. The times or time differences may be actual time data or real-time data or may be at least oriented thereto. The time differences may be formed from time stamp to time stamp and/or from a permanently predefined time.

The method according to the invention has the advantage that the transmission and evaluation of the time stamps become more robust with respect to possible losses in the transmission of the time stamps. For example, interference in the radio transmission may therefore occur, which results in a loss of time stamps. Failures can be advantageously compensated for by transmitting time stamps and consumption data in a parallel manner.

The local sensor(s) can be expediently connected to a data collector via a primary communication path, a tertiary communication path can be provided between the data collector and a head end, and the time stamps transmitted by sensors and/or by consumption meters can be collected, stored and/or evaluated in the data collector and/or in the head end. This is an automatic remote meter reading system in a fixed network (fixed network automatic meter reading). Transmitting the time stamps via the primary and tertiary communication paths makes it possible to carry out a considerably greater number of calculations and/or determinations and/or functions, including "business" functions, than before in the head end, where sufficient computing power is available.

A particular value or a particular value change or a particular value difference of the at least one physical or physico-chemical variable or the at least one physical or physico-chemical parameter can be determined in the correlation model for the assignment of a time stamp, wherein, if the particular value or the particular value difference or the particular value change is captured by the measuring element, the time stamp is triggered, is stored as such in the storage device of the sensor and is provided for transmission if the value captured by the sensor does not change, but time stamp is not generated. It is therefore typical of the method according to the invention that relatively long periods can elapse without a time stamp. Therefore, data need not be continuously transmitted. Nevertheless, the method has a very high resolution.

In particular, a gradually or incrementally increasing meter reading and/or a value table can be represented by time stamps within the scope of the correlation model.

The time stamps are preferably provided with a sign, for example a positive or negative sign. This is advantageous, in particular, when representing a value table since it is thereby stipulated whether the specific time stamp relates to a rising or falling value in the value table.

According to the invention, a plurality of time stamps can each be transmitted as a data packet along the primary communication path.

A raw measurement data stream can be advantageously generated on the basis of the time stamps arriving at the data collector and/or at the head end using the correlation model. The relevant successive time stamps are not, in particular, calculations and/or evaluations.

The time stamps can be advantageously compressed and the compression of the time stamps can be carried out in a loss-free manner. The compression of the time stamps can be carried out in a loss-free manner in the region of the sensor or the consumption meter. The time stamps can be expediently transmitted in compressed form and/or via a radio path. The transmission can be carried out repeatedly and in a conditional manner in each case after expiry of a predefined interval of time and/or after reaching a predefined quantity of time stamps which have been collected since a previous transmission. For example, the time stamps may have uniform temporal intervals in the case of a continuous flow. In this case, it is possible, for example, to combine the time stamps with the same intervals and to achieve compression of the time stamps as a result.

Alternatively, however, the compression of the time stamps can also be carried out with a predefined permissible loss level. If the data compression is carried out with a predefined permissible loss level, the compression ratio can then be increased to the detriment of lower accuracy in the reproduction at the receiver end if the user or operator prefers an energy saving and accepts a certain inaccuracy in the recovery and reproduction of the original measurement data (that is to say accepts a certain loss). The loss ratio or the compression ratio can be provided as a programmable or adjustable parameter which determines or sets the compression mode.

As clear and non-restrictive examples of data compression algorithms, the following can be taken into account within the scope of the method according to the invention: differential compression (delta encoding) in conjunction with Huffman coding, run length encoding (RLE) or preferably adaptive binary arithmetic coding (CABAC).

The consumption data expediently cannot be compressed. Since the transmission interval of consumption data is greater than that of time stamps, it is possible to dispense with compression.

The time stamps and the consumption data can be advantageously transmitted via different radio paths. In order to make the method even more robust, time stamps and consumption data can be transmitted in a parallel manner via different transmission paths, for example different radio paths. Interference in one radio path therefore does not influence the other radio path, with the result that important information can be reconstructed from a data record, that is to say from the raw measurement data or from the consumption data. It is also possible for the respective radio paths to be changed, with the result that a particular radio path is used only for a limited period.

The consumption data can be expediently transmitted to a mobile reading module and the time stamps can be transmitted to a data collector via a primary communication path. The reading intervals by means of mobile reading modules are greater than those via a data collector in a "fixed network". The consumption data have lower temporal granularity than the time stamps, with the result that greater reading intervals are possible. The available bandwidth of the "fixed network" can therefore be advantageously used to transmit the time stamps.

The consumption data and the time stamps can be advantageously combined. The combination can be expediently carried out in a remote central processing system or a head-end system. Both types of data, that is to say consumption data and time stamps, can be combined in order to ensure that all necessary information is always available in good time. In the event of communication with interference, important consumption data can therefore be determined and/or reconstructed by combining the data.

In one configuration, the preferably compressed time stamps can be stored in the head end and can be decompressed and evaluated as necessary (on demand). In this case, the time stamps are not immediately decompressed and/or evaluated in the head end, but rather are stored or held until there is a requirement for the data at a later time. For example, in the event of interference, an alarm, a fault or the like in a consumption meter, the time stamps can be decompressed and evaluated in order to obtain detailed information relating to the state present at the consumption meter.

In another configuration, the consumption data can be used to compensate for missing and/or incorrect time stamps. For example, time stamps may be missing or incorrect as a result of interference in the transmission from the consumption meter to the head end. The head end cannot correctly process and evaluate the missing and/or incorrect time stamps. The consumption data can be advantageously used to identify the missing and/or incorrect time stamps or to reset the consumption meter functions. The current consumption data can therefore be used as a base value for subsequent time stamps in order to reconstruct and evaluate the raw measurement data captured by the measuring element using the correlation model.

It is possible for the consumption data and the time stamps to be compared in order to carry out a consistency check. In this case, the consumption data may comprise, for example, an absolute meter index at a particular time, for example an expiry date provided by the consumption meter. On the other hand, the time stamps can be used, for example, to calculate an absolute meter index. The calculation can be carried out in the head end, for example, with the result that an expiry date provided by the head end can be calculated. These two values can be compared for a consistency check. So that the consumption data are consistent with the time stamps, the absolute meter indices from the consumption meter and from the head end must be identical at a particular time, for example. If the absolute meter indices are not identical, this indicates a discrepancy between consumption data and time stamps. Measures can then be taken to correct this discrepancy.

The reconstructed raw measurement data stream can preferably be evaluated, in the further course of the data processing, at any time on a time-historical basis without a time gap irrespective of its temporal resolution (sampling rate or multiple of the sampling rate). This results in the advantage that, for example, even event-related state changes in the supply network in the past (for example overflow, underflow, leakages, manipulation attempts etc.) can be determined and documented with a precise time allocation and without gaps. There is a high degree of accuracy in the temporal resolution as a result of highly granular time-discrete sampling. It is also possible to display past consumption data to the consumer in a considerably more accurate manner and/or to better incorporate them in evaluations with respect to the consumption behavior or changes in the latter. This in turn has the effect of optimizing consumption and is a particularly important item of information from the network supplier for the consumer.

For example, the elementary measuring units may be the electrical voltage or the current intensity which is measured. For example, the output voltage of a Hall sensor in the event of its excitation or the voltage of a temperature sensor can be captured. The measured physical variable can expediently relate to a supply medium, preferably water, electricity, fuel or gas, of a supply network.

It is possible for the or one of the measured physical or chemico-physical parameters to be characteristic of the quantity, quality and/or composition of a fluid which flows through the relevant sensor or with which contact is made by the latter.

The elementary measuring unit can expediently generate a time stamp as soon as the elementary measuring unit receives a pulse.

It is possible for the raw measurement data stream to have a temporal resolution which is determined or conditioned by the sensor sampling rate or measuring element sampling rate or a multiple thereof. The raw measurement data stream expediently has a temporal resolution which is determined or at least conditioned only by the sensor sampling rate or measuring element sampling rate or a multiple thereof. The temporal resolution of the raw measurement data stream is preferably in the seconds range, the tenths of a second range, the hundredths of a second range or the thousandths of a second range.

The raw measurement data stream is advantageously continuous and/or complete taking the determined resolution as a basis. This results in a very particularly high measured value resolution along the continuous temporal profile and in turn a particular depth of information as a basis for evaluations or calculations based thereon.

In order to generate the continuous raw measurement data stream, the data packets are expediently combined in a corresponding time sequence reference or are at least related to one another, with the result that the time stamps contained in the packets are subsequently combined again along the real-time axis in accordance with their sampling and prior division into packets, or are at least temporally related to one another in a continuous manner.

Settling the question of when a new data transmission should be carried out in the form of a message or a telegram (of one or more data packets) preferably depends on whether at least one of the two conditions:
(a) expiry of a predefined interval of time; and
(b) reaching a predefined quantity of time stamps since the previous transmission has been satisfied. A time sequence reference of the data packets to be transmitted can be easily implemented on the basis of this.

It is particularly expedient that the method comprises packaging the time stamps by formatting them in data packets of a predetermined fixed size, wherein, each time the accumulated data reach the size of a data packet or the predefined interval of time has expired, a new transmission is initiated.

It is possible to carry out the data transmission with redundancy. The redundancy in the transmission can be expediently achieved by repeatedly transmitting the same data packet in a plurality of successive transmission operations or on different communication paths or radio channels. It is also possible for the redundancy in the transmission to be achieved by repeatedly transmitting the same time stamps. For example, the transmission of a data packet or a time stamp can be repeated five times.

The present invention also claims, in a coordinate claim, a sensor which is set up for local use in a supply network which contains a plurality of local sensors and is intended to distribute a consumption medium, for example water, gas, electricity, fuel or heat. The sensor can be advantageously operated in accordance with a method according to at least one of the method claims. Such a sensor may be part of a consumption meter. During operation of a supply network, said sensor makes it possible to ensure the consumption and further state properties in a very high resolution along the temporal profile in a gapless and continuous manner.

The present invention furthermore also claims a data collector. The data collector can be advantageously operated in accordance with a method according to at least one of the method claims.

Finally, the present invention also relates to a measurement data information network having at least one local sensor, preferably a plurality of local sensors, for generating and/or forwarding time stamps on the basis of raw measurement data on the basis of the correlation model, preferably raw measurement data in connection with a consumption of consumption medium and/or an operating state of a consumption meter, having a data collector, a primary communication path between the respective sensor and the data collector, a head end for evaluating the data and a tertiary communication path between the data collector and the head end. According to the present invention, the measurement data information network is characterized in that the sensor(s) in the network is/are operated in accordance with a method according to at least one of the method claims.

Other features which are considered as characteristic for the invention are set forth in the appended claims.

Although the invention is illustrated and described herein as embodied in a method for collecting data and a sensor, a data collector and a measurement data information network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIGS. 2A-2B are highly simplified illustrations showing an example of the transmission of time stamps of characteristic raw measurement data and consumption data to the head end via different communication paths;

DETAILED DESCRIPTION OF THE INVENTION

Figure 1:
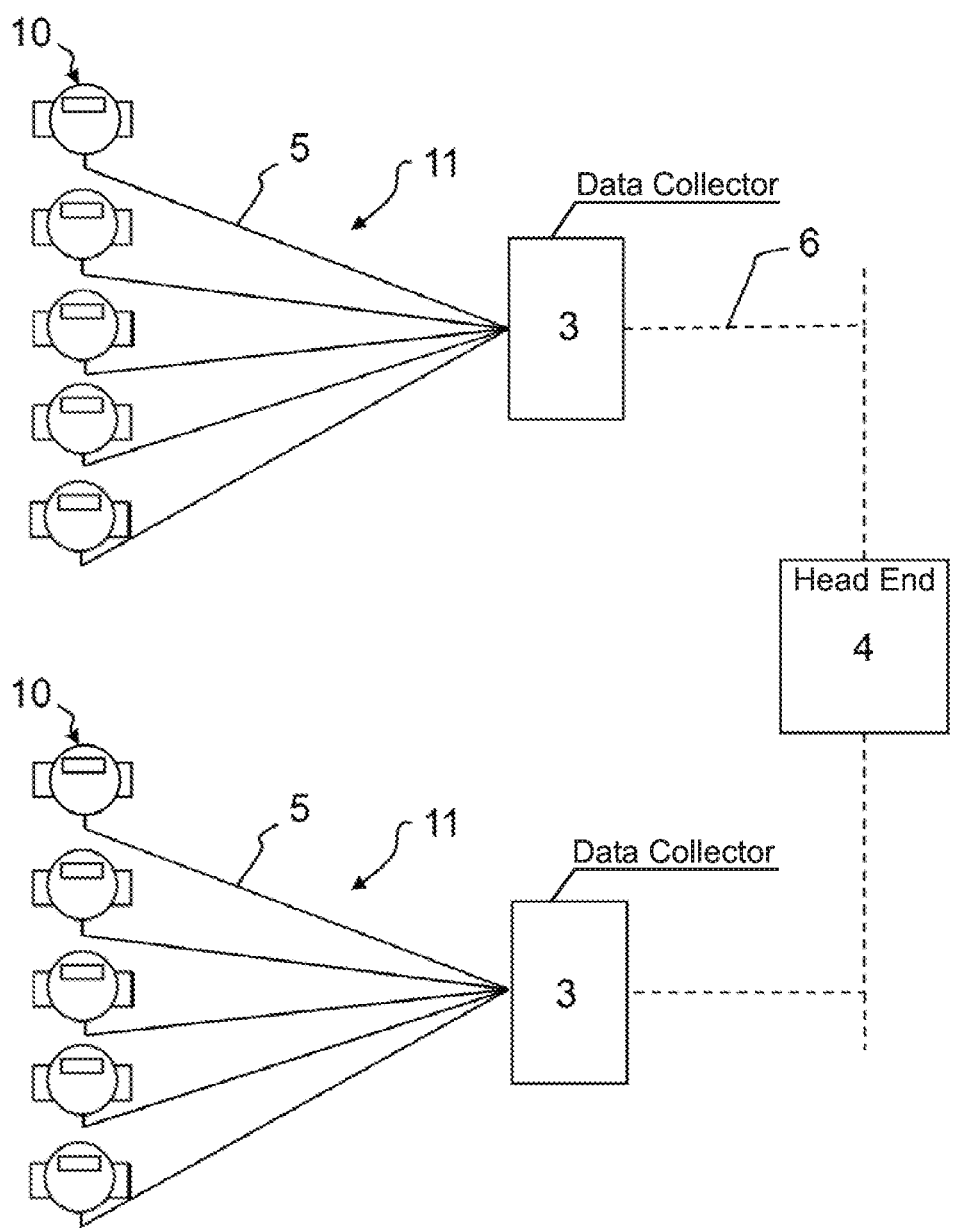
FIG. 1 is diagrammatic, highly simplified schematic illustration of an example of communication paths of a supply network for collecting and/or forwarding data, which have been recorded by a multiplicity of consumption meters, to a data collector and a head end.

Referring now to the figures of the drawings in detail and first, particularly to FIG. 1 thereof, there is shown a measurement data information network, for example within the scope of distributing consumables, for example gas, water, electricity, fuel or heat. The supply network contains a multiplicity of individual local arranged consumption meters 10 which may be assigned to different residential units of an apartment building, for example. The individual consumption meters 10, for example water meters, flow meters, heat meters, electricity meters or gas meters, are connected by radio (radio path 11) to a (stationary or mobile) data collector 3, which can act as the master or concentrator, via a primary communication path 5.

Each individual consumption meter 10 may be expediently provided with an associated ID (address), with the result that each individual consumption meter 10 can be directly addressed by the data collector 3 and the data present in the respective consumption meter 10 can be retrieved.

The transmission via the primary communication path 5 is predefined by a bus transmission protocol, for example by the wireless M-bus transmission protocol.

The respective data collector 3 is connected to a so-called head end 4 via a tertiary communication path 6. The data from the entire supply network converge in the head end 4. The tertiary communication path 6 may be a wired communication path or a communication path based on radio technology (for example a mobile radio communication path). Alternatively, the data from the respective data collector 3 can also be read by a portable reading device if necessary and can be read in again at the head end 4. The data can be transmitted in different ways along the tertiary communication path 6, for example via LAN, GPRS, LTE, 3G etc.

The individual consumption meters 10 can be operated using an independent energy supply (rechargeable battery).

As schematically illustrated in FIG. 1, the preferably compressed and formatted time stamps TS of each relevant sensor 1 or consumption meter 10 are transmitted to the data collector 3 which manages a local network of a multiplicity of consumption meters 10 or sensors 1 assigned to it. The preferably compressed and formatted time stamps TS of each of the sensors 1, which are part of the supply network, are transmitted from the data collector 3 to the head end 4.

The data collector 3 can store the time stamps TS retrieved from the respective sensors 1 or consumption meters 10 either over an interval of time (for example one day) and can then forward them to a processing location or to the head end 4. Alternatively, the data can also be immediately forwarded to the head end 4 from the data collector 3.

Figure 2B:
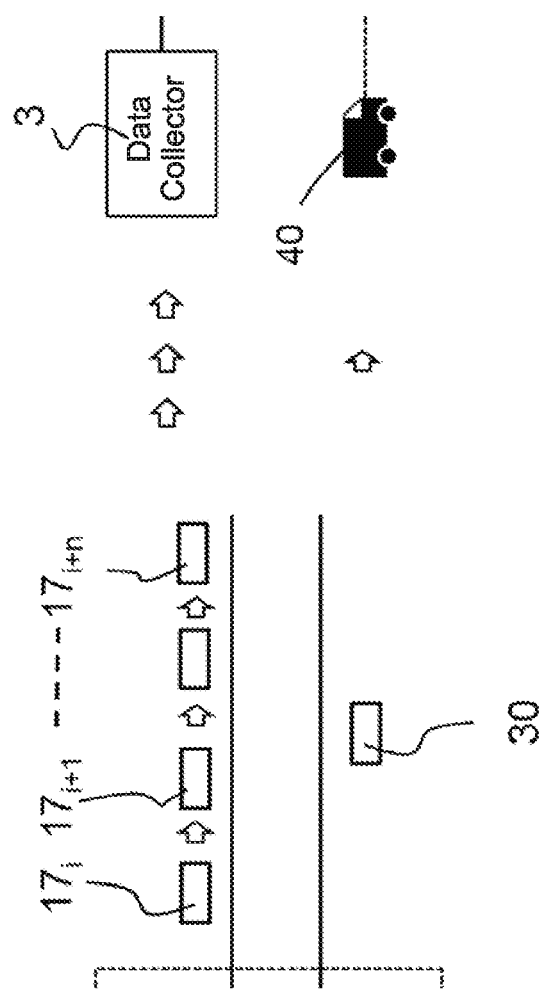

According to FIGS. 2A and 2B, the respective consumption meter 10 contains a sensor 1 equipped with at least one measuring element 9. The sensor 1 is provided for the purpose of generating, via the measuring element 9, raw measurement data which are supplied to a measurement data preparation means 14. The raw measurement data correspond to elementary measuring units of the at least one physical or physico-chemical variable or of the at least one physical or physico-chemical parameter which are provided by the measuring element 9. The raw measurement data may be, for example, raw data in connection with the flow of a medium through a supply line 16, for example a water pipe, in particular the flow rate, the turbidity, the presence of pollutants or the presence of a solid and/or gaseous component or solid and/or gaseous components. It is pointed out that the sensor 1 may alternatively also be a pressure sensor, a temperature sensor, a humidity sensor, an acceleration sensor, a height sensor or a motion sensor.

The measured value preparation means 14 of the consumption meter 10 contains a storage device 7, a time reference device 15 (crystal) and a microprocessor 8. The above-mentioned components may be provided separately or as an integrated complete component. The consumption meter 10 may comprise its own power supply (not illustrated) in the form of a battery or the like if necessary. The consumption meter 10 can therefore be operated in an autonomous manner in terms of energy.

Prior to the steps illustrated in FIG. 2A and FIG. 2B, a particular value, a particular value change or a particular value difference of the at least one physical or physico-chemical variable or of the at least one physical or physico-chemical parameter is determined within the scope of the correlation model for the assignment of a time stamp TS.

As shown in FIG. 2A, the following steps are carried out according to the invention in the region of the respective consumption meter 10:

a) Triggering a time stamp TS if the particular value, the particular value change or the particular value difference is captured by the measuring element 9.
b) Storing the time stamps TS in the storage device 7 of the sensor 1 or of the consumption meter 10.
c) Generating consumption data from the elementary measuring units. In this case, the consumption data are stored in the storage device 7 until transmission.
d) Transmitting the time stamps TS, preferably in compressed form, via a radio path 11 by preparing time stamp telegrams $17_i, 17_{i+1}, 17_{i+n}$ in the measurement data preparation means 14, which telegrams are gradually transmitted to a central processing system, for example a head end 4. The microprocessor 8 carries out the compression for the transmission.
e) Transmitting the consumption data in non-compressed form via a radio path 11 by preparing a consumption data telegram 30 in the measurement data preparation means 14, which telegram is transmitted to a central processing system, for example a head end 4.

Accordingly, time stamp telegrams $17_i, 17_{i+1}, \ldots, 7_{i+n}$ containing continuous time stamps TS are transmitted in temporal succession. At the receiver end, a continuous gapless raw measurement data stream of very high resolution can be reconstructed from these time stamps TS using the correlation model.

The preferably compressed time stamps TS and the preferably non-compressed consumption data are transmitted by the consumption meter 10 in a parallel manner. These two types of data can be combined, for example in the head end 4. Further information relating to the consumption meter and/or relating to the measurement data information network can be generated by combining the data.

FIG. 2B shows an alternative transmission of the time stamps TS and the consumption data. The non-compressed consumption data are read via a mobile data collector 40, for example during a drive-by, a walk-by or the like. The mobile data collector 40 can read a plurality of consumption meters 10 during a reading tour. After the reading tour, the mobile data collector 40 transmits the recorded consumption data to the head end 4. The preferably compressed time stamps TS are transmitted, for example, via a measurement data information network having a primary communication path 5 in the form of a radio path 11 to a data collector 3. The data collector 3 is in turn connected to the head end 4 via a tertiary communication path 6. The data can be transmitted along the tertiary communication path 6 in different ways, for example via LAN, GPRS, LTE, 3G etc.

In the head end 4, the time stamps TS and the consumption data are combined in order to generate further information.

Figure 3:
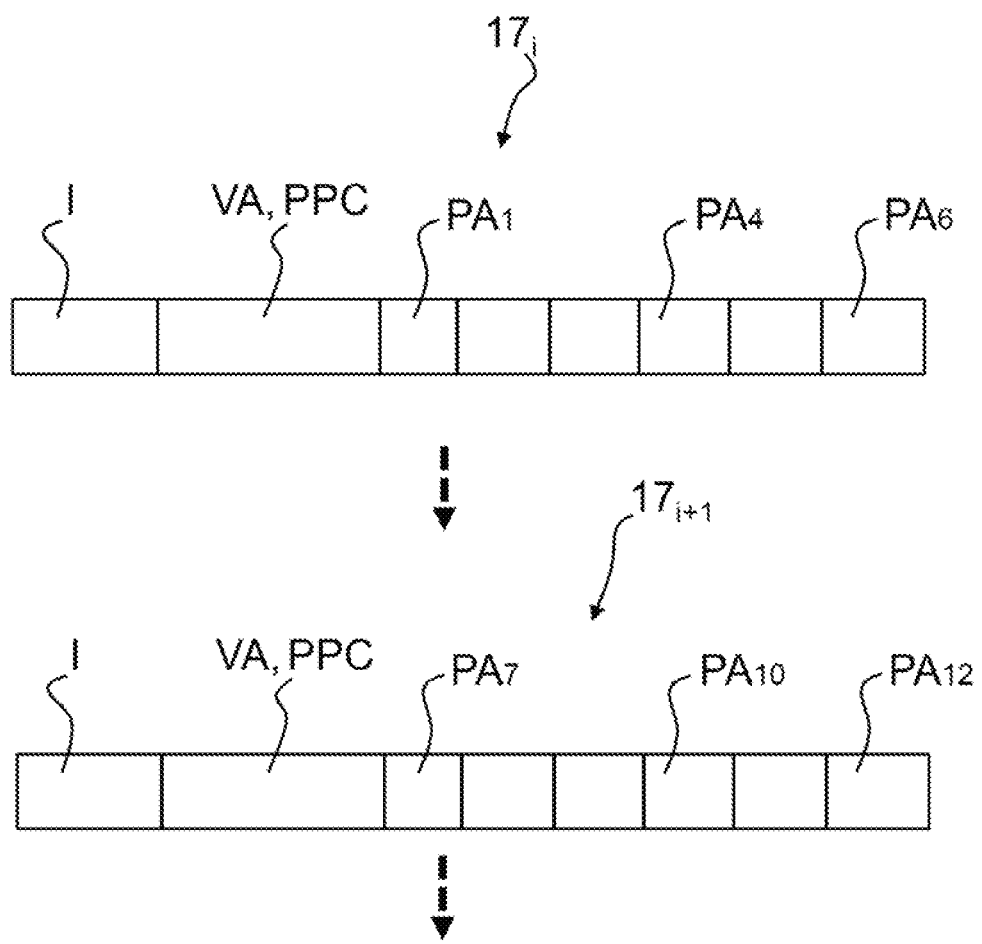
FIG. 3 is an illustration showing an example of a message structure which is emitted by or retrieved from the measurement data preparation means of the consumption meter via the primary communication path.

As illustrated by way of example in FIG. 3, provision may also be made for the identity (address) I of the relevant sensor 1 and/or the absolute or cumulative value VA of the physical or physico-chemical variable or parameter measured by the relevant sensor 1 to also be transmitted, together with the $PA_j$ packets of the time stamps TS, in the respective time stamp telegram $17_i, 17_{i+1}, \ldots, 17_{i+n}$, wherein the value VA can be provided with a time stamp or can be assigned to one of the elementary time-stamped items of measurement data, for example an index value of a fluid meter. According to one exemplary embodiment, the value VA may be, for example, the meter reading of a water meter at a particular time or the flow rate through the water meter since a previous data transmission (for example the sum $\Sigma$ of the time stamps TS; corresponds to the sum $\Sigma$ of the flow rate; see FIG. 4).

The method may also involve reading and transmitting the value of at least one other physical or physico-chemical parameter PPC of the environment of the relevant sensor 14 of the fluid measured by the latter at a particular time with the $PA_j$ packets of time stamps TS, for example the conductivity of the fluid, the temperature of the fluid, the pH value of the fluid, the pressure of the fluid, and/or a parameter which is characteristic of the quality and/or the composition of the fluid and/or the temperature of the installation environment of the sensor 1.

FIG. 3 shows, by way of example, the individual time stamp telegrams $17_i, 17_{i+1}, \ldots, 17_{i+n}$ according to FIG. 2A and FIG. 2B in somewhat more detail. The time stamp telegrams $17_i, 17_{i+1}, \ldots, 17_{i+n}$ each comprise, on the one hand, a plurality of data packets $PA_1$-$PA_6$ and $PA_7$-$PA_{12}$, the absolute or cumulative value VA and the value of at least one other physical or physico-chemical parameter PPC of the environment of the relevant sensor 1 or of the fluid measured by the latter at a particular time, for example the conductivity of the fluid, the temperature of the fluid, the pH value of the fluid, the pressure of the fluid, a parameter which is characteristic of the quality and/or the composition of the fluid and/or the temperature of the installation environment of the sensor 1.

As is also illustrated in FIG. 3 as an example, provision may be made for the compressed time stamps TS to be packaged by formatting the $PA_j$ packets, the size of which must not exceed a predefined maximum value, wherein, each time the accumulated data reach the size of a packet $PA_j$, a new packet or telegram is formed or a new transmission is initiated provided that the predefined interval of time has not previously expired.

According to one preferred variant of the invention, the time stamps TS are compressed before their transmission. The compression of the time stamps TS can be carried out in a loss-free manner.

Alternatively, the compression of the time stamps TS can also be carried out with a predefined permissible loss level. In fact, the compression ratio can then be increased to the detriment of lower temporal accuracy in the reproduction at the receiving end if the user or operator prefers an energy saving and accepts a certain inaccuracy in the recovery and reproduction of the original raw measurement data (that is to say accepts a certain loss). This loss ratio or the compression ratio can be provided as a programmable or adjustable parameter which determines or sets the compression mode.

As clear and non-restrictive examples of data compression algorithms, the following can be taken into account within the scope of the method according to the invention: differential encoding (delta encoding) in conjunction with Huffman coding, run-length encoding (RLE) or preferably adaptive binary arithmetic coding (CABAC).

It is possible for the time stamps TS in the storage device 7 of the consumption meter 10 to be deleted only when the transmission of the time stamps TS has been confirmed by the receiver or data collector 3.

Thanks to the invention, it is possible to have, at the data collector 3 or receiving location (for example head end 4), information which makes it possible to authentically and completely reconstruct all time stamps TS provided by the various sensors 1 in a very high temporal resolution and permits unlimited flexibility in the evaluation of said data. The expansion capability of "business" functions can be easily and centrally taken into account without influencing the method of operation or even the structure of subassemblies (sensors, communication means and the like).

The structure of the sensor 1 can be simpler and its operation can be more reliable in comparison with previously known solutions. Furthermore, the energy consumption of the subassembly comprising the sensor 1 and the communication means 2 is lower than in the current embodiments which locally evaluate the data.

The invention can be applied to the measurement and remote reading of a wide variety of parameters and variables. It suffices to be able to accurately date an elementary change (which can be measured by the sensor 1) in a parameter or a variable in accordance with the resolution of the sensor 1 in question (the time stamp TS can correspond to the resolution of the sensor 1 or possibly to a multiple of this resolution).

If the measured variable or the measured parameter can also change decrementally, the time stamps TS are elementary measuring units provided with signs (positive or negative units).

In connection with an advantageous use of the invention, in connection with the term of consumption, provision may be made for the or one of the measured physical variables to relate to a flow medium, wherein each time stamp TS corresponds to an elementary quantity of fluid which is measured by the sensor 1 depending on its measurement accuracy. The measured fluid may be, for example, gas, water, fuel or a chemical substance.

As an alternative or in addition to the embodiment variant mentioned above, the invention may also provide for the or one of the measured physico-chemical variables to be selected from the group formed by the temperature, the pH value, the conductivity and the pressure of a fluid which flows through the relevant sensor 1 or with which contact is made by the latter.

If at least one parameter is alternatively or additionally measured, this or one of these measured physical or physico-chemical parameters may be characteristic of the quality and/or composition of a fluid which flows through the relevant sensor 1 or comes into contact with the latter, for example turbidity, the presence of pollutants or the presence of a solid and/or gaseous component or solid and/or gaseous components.

It goes without saying that the above-mentioned variables and parameters are only examples which are not restrictive.

Accordingly, time stamp telegrams 17 are continuously formed at a particular time and are gradually transmitted. The sum of the individual data packets $PA_1, \ldots, PA_n$ then forms a continuous time-stamped raw measurement data stream 13.

Figure 4:
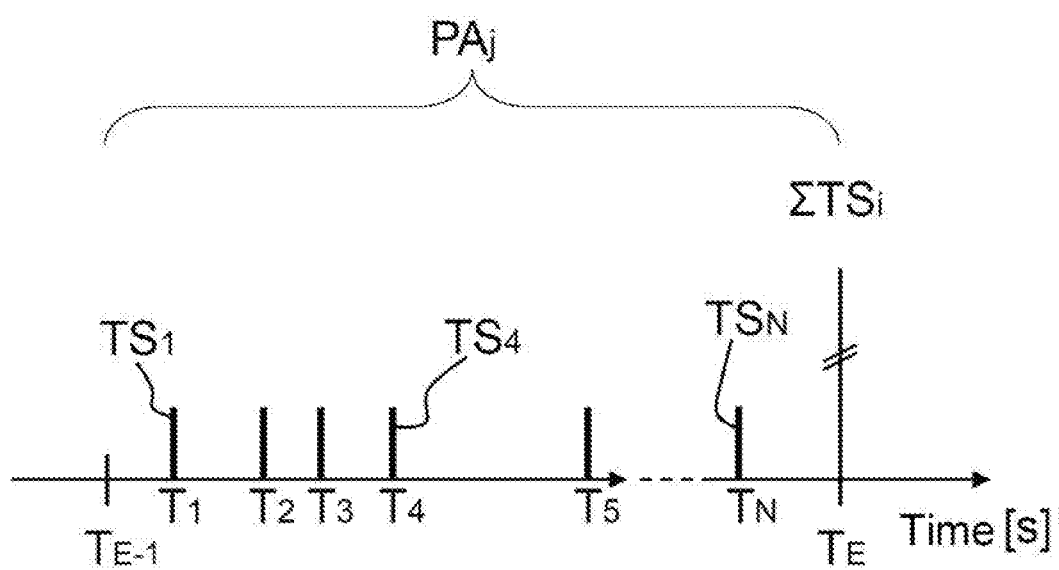
FIG. 4 is an illustration showing an example of a chronogram of time stamps of the raw measurement data read from a sensor between two uplink transmission operations (messages or telegrams which are emitted at the times TE-1 and TE), in a context of the remote reading of the volume consumption (in this case, the packet $PA_j$ contains N time stamps)

FIG. 4 shows, by way of example, an example of a message structure which is transmitted from the sensor 1 or, for example, the consumption meter 10 to the data collector 3 or to the head end 4. Each time stamp $TS_1$ to $TS_N$ corresponds in this case, within the scope of the correlation model, to an elementary quantity of fluid which is measured by the sensor 1. The measured fluid may be, for example, gas, water, fuel or a chemical substance. In the interval of time $T_{E-1}$ to $T_E$, N pulses are therefore measured and the time stamps $TS_1$ to $TS_N$ are stored, which, in the case of an amount of one litre for each time stamp TS for example, corresponds to a flow rate of a total of N litres within this interval of time. The measured value preparation means forms a data packet $PA_j$ containing N time stamps $TS_1$ to $TS_N$. Data telegrams $17_i$, $17_{i+1}$ are formed from the plurality of data packets, for example $PA_1$ to $PA_6$ and $PA_7$ to $PA_{12}$, according to FIG. 3.

So that the method according to the invention can be adapted to changes in the development of the parameter or the measurement variable and satisfactory updating of the available instantaneous data is ensured at the same time, the method can advantageously involve, in particular, forming a new packet or telegram 17 or carrying out a new data transmission in the form of a message or a telegram as soon as at least one of the two conditions below has been satisfied:

(a) A predefined interval of time has expired, and/or
(b) a predefined quantity of, in particular, compressed collected data or time stamps TS since the previous transmission has been reached.

The use of condition (b) can involve, for example, regularly checking the size of all new time stamps TS in compressed form after a predefined number of new time stamps TS have been created. If these sizes are close to a critical size, for example close to the size of a packet stipulated by the transmission protocol, a new transmission operation is carried out (condition (b) satisfied before condition (a)) unless the predefined interval of time between two successive transmissions has expired first (condition (a) satisfied before condition (b)).

Figure 5:
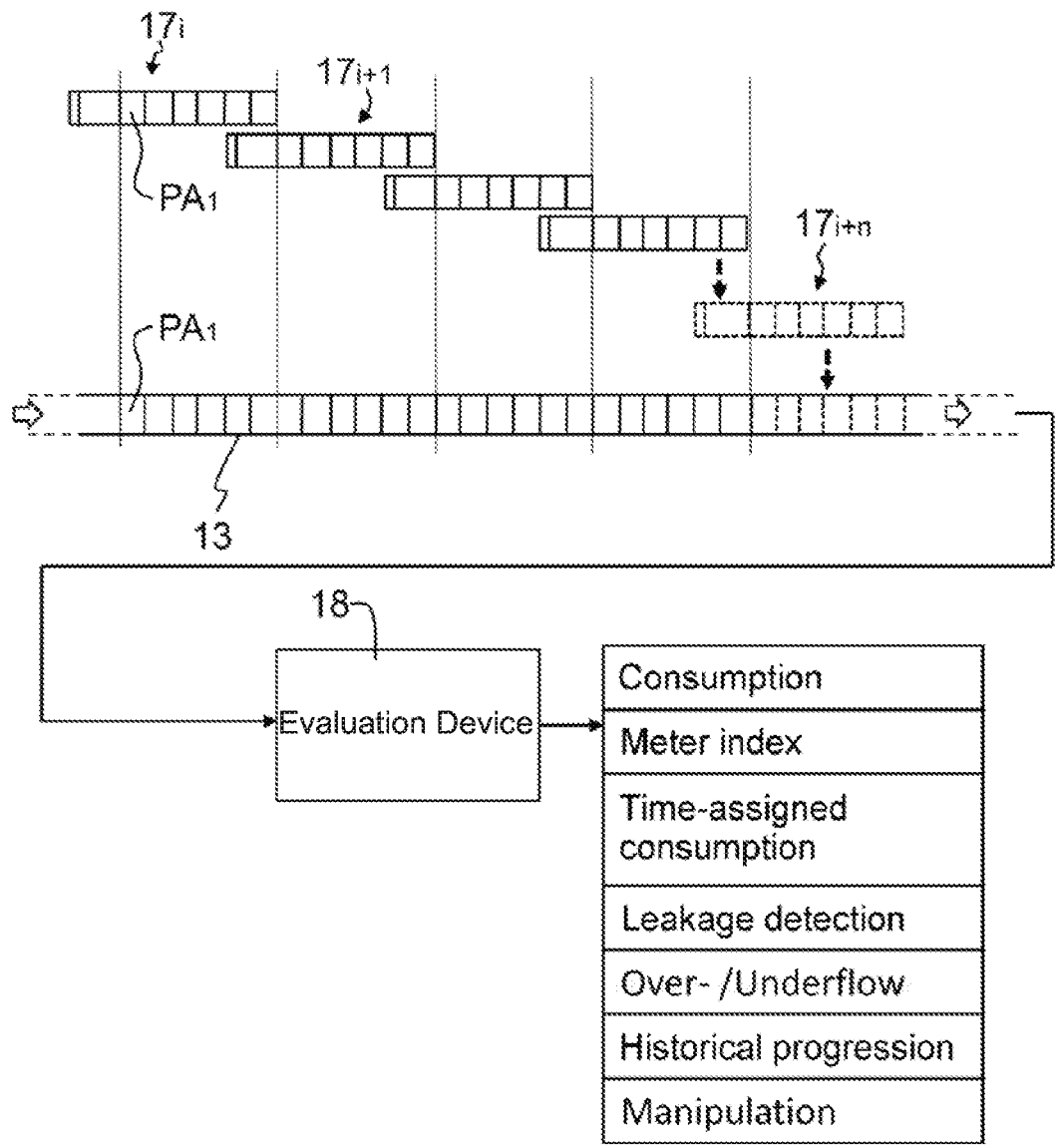
FIG. 5 is an illustration showing an example of the combination of the data packets or messages or telegrams containing the time stamps and reconstructions to form a time-continuous raw measurement data stream including its evaluation possibilities in a highly simplified schematic manner of illustration.

FIG. 5 shows the further processing of the individual time stamps TS provided in time stamp telegrams $17_i$-$17_{i+n}$ to form a continuous cohesive assignment, from which a gapless raw measurement data stream 13 can be reconstructed on the basis of the correlation model. In this case, the individual time stamp telegrams $17_i$-$17_{i+n}$ are combined in such a manner that the respective data or data packets $PA_j$ or the time stamps TS contained therein are temporally related to the adjacent data packets $PA_j$.

Figure 6:
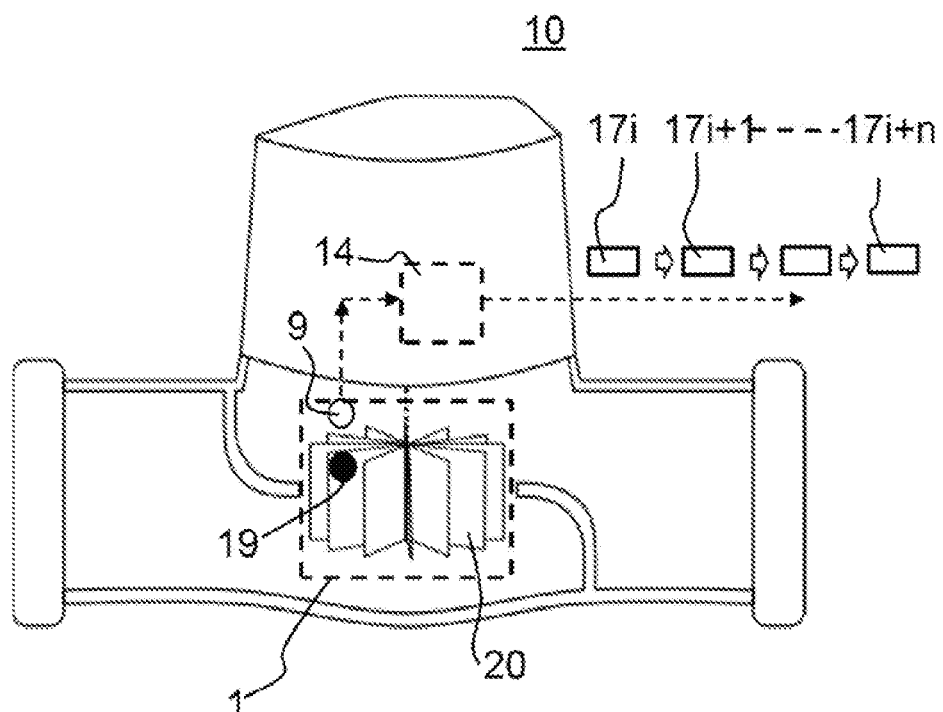
FIG. 6 is an illustration showing an example of the sensor in a consumption meter in the form of a mechanical flow meter having an impeller, which can be used to generate corresponding time stamps of raw measurement data for the flow.

FIG. 6 illustrates, only by way of example, a mechanical flow meter 10 having a sensor 1 for the flow. The sensor 1 contains an impeller 20, a measuring element 9 in the form of a Hall sensor, for example, and a pulse generator element 19 which rotates to a greater or lesser extent depending on the flow through the flow meter 10. The rotational movement of the impeller 20 is captured by the measuring element 9 as a voltage value which is excited by the pulse generator element 19 provided that the relevant vane of the impeller 20 is at the position of the measuring element 9. As a result of the correlation model, it is known, during evaluation, what flow volume one revolution corresponds to. One revolution of the impeller 20 may correspond, for example, to one litre of fluid.

Figure 7:
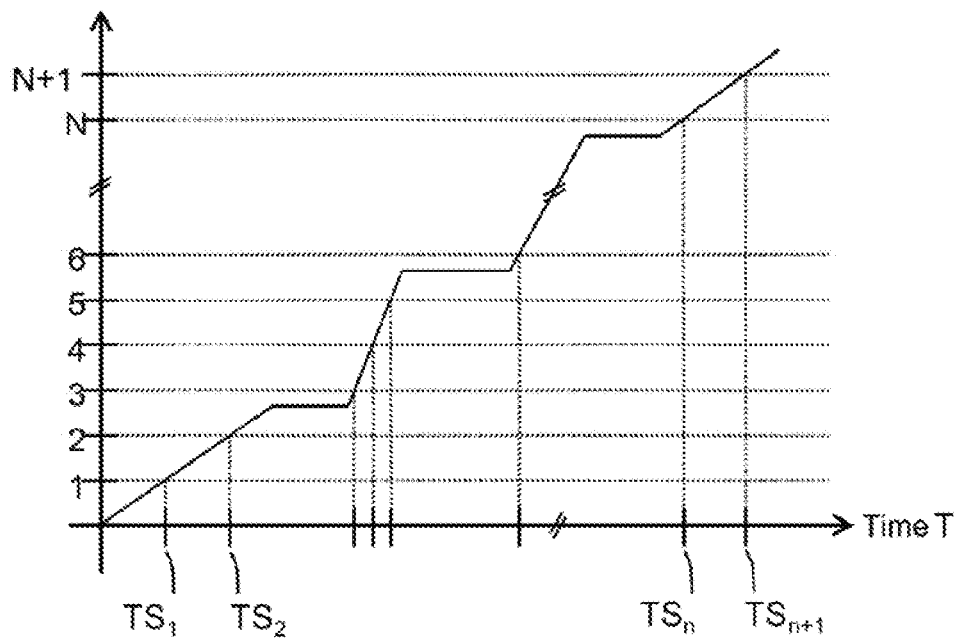
FIG. 7 is a graph showing an example of a correlation model for generating time stamps on the basis of the raw measurement data acquired by the sensor according to FIG. 6.

A correlation model is stored in the measured value preparation means 14 and is used to determine in advance the conditions for generating time stamps TS for particular raw measured values. FIG. 7 shows a simplified illustration of an example of such a correlation model, for example for a continuous cumulative flow measurement. In this case, the measuring unit is, for example, a pulse captured by the measuring element 9 of the sensor 1 illustrated in FIG. 6, for example a voltage pulse corresponding to one revolution of the impeller 20. The predefined resolution of the measuring method therefore corresponds in this example to one revolution of the impeller 20. The raw measured values, that is to say the pulses triggered by the revolutions, and the associated times T, are stored in the storage device 7 of the sensor 1. The measured value preparation means 14 generates an associated time stamp $TS_1$, $TS_2$ ... to $TS_{n+i}$ for each raw measured value (that is to say for each revolution/pulse). The time stamps TS are continuously stored in the storage device 7. If the impeller 20 does not rotate, a pulse is not generated and a time stamp is therefore not provided either. If the impeller 20 rotates more slowly, the time at which the pulse is captured along the time axis T is accordingly later. Accordingly, a later time stamp TS is generated in this case. As is clear from FIG. 7, a multiplicity of time stamps TS are therefore generated and define the flow continuously measured over the relevant period.

The time stamps TS are combined in data packets $PA_j$ and, according to FIG. 2, are gradually transmitted on request by the data collector 3 to the latter as data telegrams $17_i$, $17_{i+1}$, $17_{i+n}$ via the primary communication path 5. The data transmission can preferably be carried out here in compressed form. It is consequently a continuous gapless time stamp data stream of very high resolution which is transmitted along the primary communication path 5 in the form of the individual continuous data telegrams $17_i$, $17_{i+1}$, ..., $17_{i+n}$.

Figure 8:
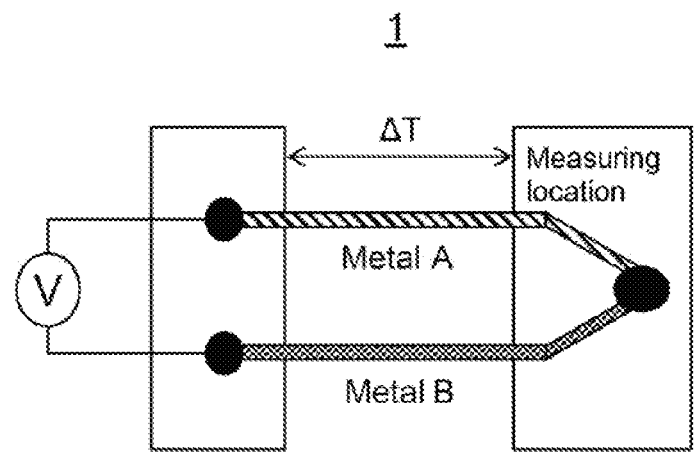
FIG. 8 is an illustration showing an example of a temperature sensor.

The collection of data is not restricted to a flow measurement. FIG. 8 shows, for example, a sensor 1 in the form of a temperature sensor based on a resistance measurement. The temperature sensor contains two metal conductors (A, B) which are connected to one another in the region of a measuring location and have different thermal conductivity. In the event of a temperature difference ΔT between the measuring location and the opposite end of the two conductors, a voltage V or a voltage change can be tapped off. In this case, a time stamp TS for a change in the voltage captured by the sensor can be determined as a correlation model.

Figure 9:
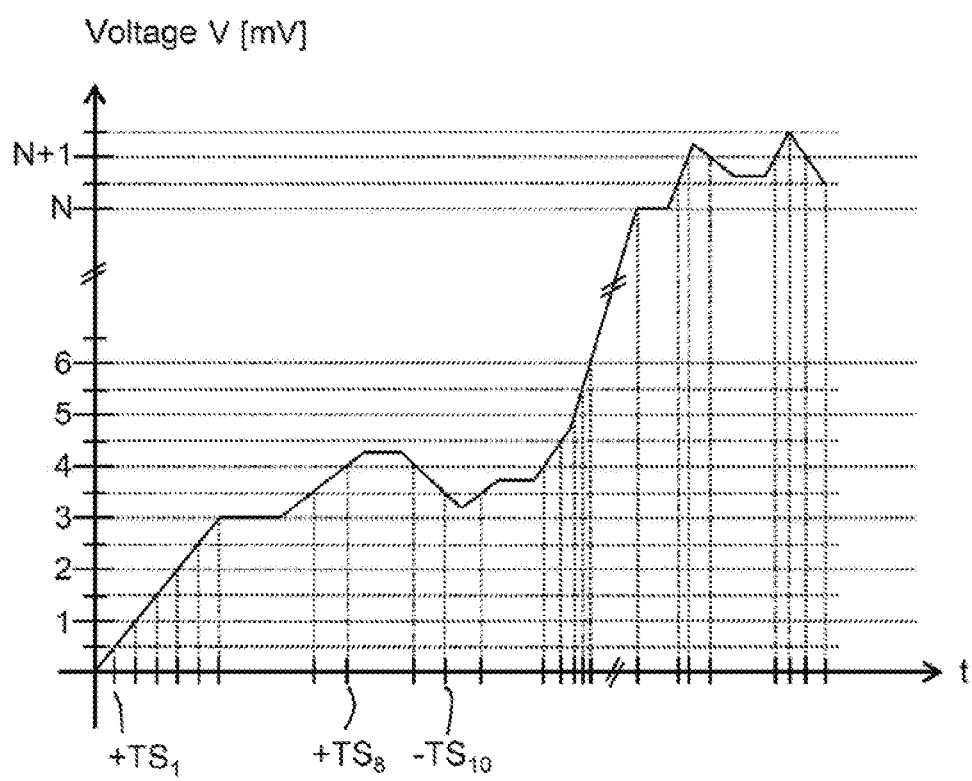
FIG. 9 is a graph showing another example of the correlation model for generating time stamps on the basis of the raw measurement data acquired by the sensor according to FIG. 8.

FIG. 9 shows an example of a corresponding raw measurement data curve of voltage values V for generating corresponding time stamps TS in a temperature measurement. Accordingly, an associated time stamp TS is generated for each rise or fall of the voltage, for example by 0.5 mV. The determined resolution of the method is therefore 0.5 mV. Since the curve profile may be rising and falling in the case of a temperature measurement, the time stamps are provided in this case with a sign "+" for rising or "−" for falling. As becomes clear from FIG. 9, a continuous sequence of time stamps TS, which represent the measured voltage profile and therefore the temperature over the period in question in a very accurate and gapless manner, is also obtained here. If the temperature, that is to say the voltage V, does not change, a time stamp is not generated. For the rest, the method corresponds to the measures explained in connection with the initially described example of flow measurement.

As a result of the inventive collection of time stamps TS which are provided by the sensors 1 or consumption meters 10 of the or a particular network, the invention enables all types of evaluation, analysis, checking, monitoring and generally useful or desired processing and utilization since the fundamental individual raw information is available. The evaluation of the provided time stamps TS is preferably carried out in the region of the head end 4 using evaluation device 18 and reveals a multiplicity of items of important information which are needed to manage the supply network but were previously not able to be generated, for example consumption, meter index, time-assigned consumption, leakage detection, over/underflow, historical progression and/or manipulation. Information can therefore also be retrospectively retrieved without a time gap at any time and can be supplied to a previous evaluation.

The raw measurement data reconstructed from the time stamps TS are present in the head end 4, according to the invention, in a very high resolution or granularity without time gaps as a raw measurement data stream 13. Consequently, in contrast to previous methods, very much more usable data than before are available in the head end 4 on account of the method according to the invention.

The raw measurement data stream 13 present in the head end 4 preferably has a resolution in the seconds range, tenths of a second range, hundredths of a second range, thousandths of a second range or even ten thousandths of a second range.

As schematically illustrated in FIG. 1, the invention also relates to a measurement data information network, for example for a supply network for distributing a consumable, in particular a fluid consumable, for example using consumption meters 10 which have been accordingly set up and contain sensors 1 which are operated in the supply network. The respective consumption meter 10 contains, cf. FIG. 2, at least one sensor 1 which can acquire raw measurement data via a measuring element 9. Furthermore, the respective consumption meter 10 contains a measurement data preparation means 14 which contains the microprocessor 8, the storage device 7 and the time reference device 15. In the measurement data preparation means 14, a time stamp TS is effected on the basis of the raw measurement data, the time stamps TS are compressed and preparation is effected into a format which is suitable for transmission via a radio path 11 or via the primary communication path 5 according to a particular protocol.

The consumption meter 10 may comprise its own power supply (not illustrated) in the form of a battery or the like if necessary. The consumption meter 10 can therefore be operated in an autonomous manner in terms of energy.

According to FIG. 5, the evaluation device 18 is provided in the region of the head end 4 and are able to combine the time stamps TS in the individual time stamp telegrams $17_i$-$17_{i+n}$ or their data packets $PA_j$ in a time-continuous manner and without gaps to form a continuous gapless raw measurement data stream 13 and to carry out corresponding decompressions, evaluations, calculations and the like therefrom. The corresponding data preferably comprise all sensors 1 or consumption meters 10 in the measurement data information network or supply network.

In addition, the above-mentioned system contains, for the relevant or each geographical area in which the consumption meters 10 are installed, a fixed data collector 3 (concentrator) which, with the consumption meters 10 in the area allocated to it, forms a primary communication path 5 of the supply network. The primary communication path 5 may be in the form of a radio path 11, for example. The data collector 3 is in turn connected to the head end 4 via a tertiary communication path 6. The data can be transmitted in different ways along the tertiary communication path 6, for example via LAN, GPRS, LTE, 3G, 4G etc.

The storage device 7 of each sensor 1 or consumption meter 10 preferably form a buffer memory and are suitable and set up to store the content of a plurality of $PA_j$ packets of time stamps TS, in particular in the compressed state, wherein the content or a part of the content of this buffer memory is transmitted during each transmission or retrieval by the data collector 3.

The information collected by each data collector 3 is directly or indirectly transmitted to the head end 4. The "business" functions are also defined and carried out there.

Figure 10:
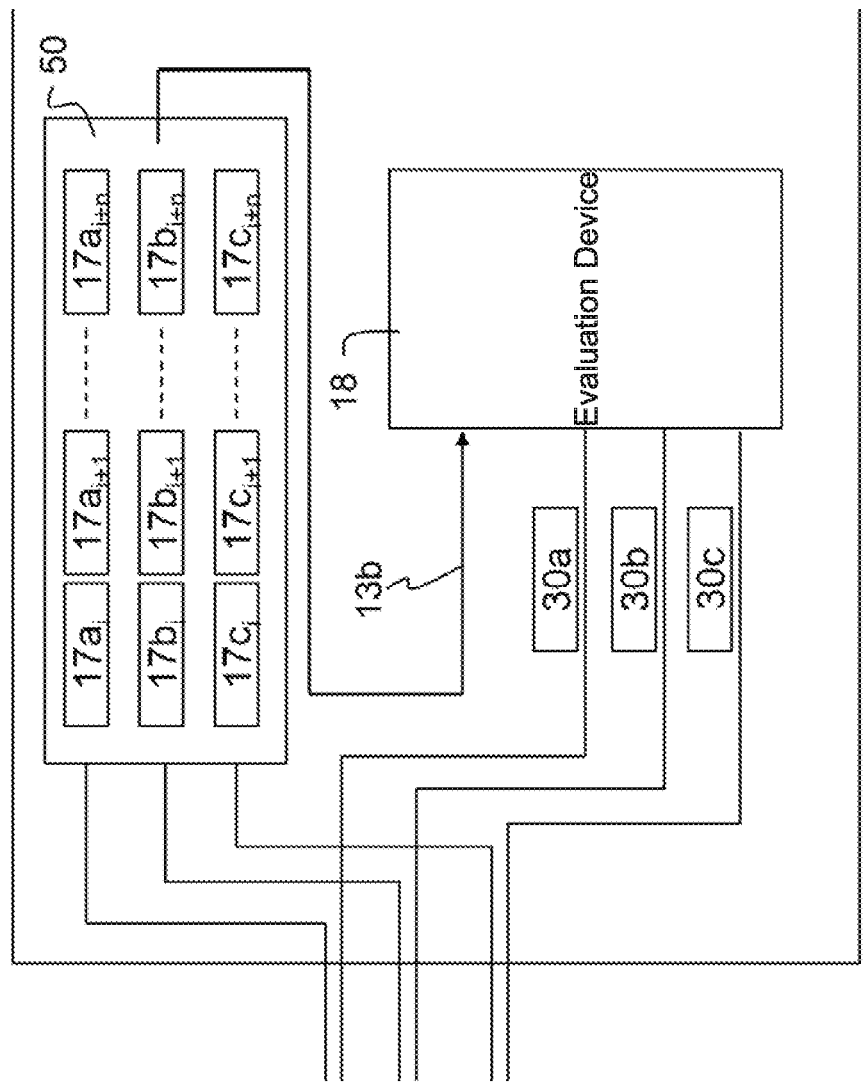
FIG. 10 is an illustration showing the holding of non-decompressed time stamps in the head end.

In one configuration according to FIG. 10, provision is made for detailed information to be provided on the basis of the time stamps TS as necessary (on demand). FIG. 10 shows, by way of example, three consumption meters 10a, 10b and 10c which each transmit time stamp telegrams 17a, 17b and 17c and consumption data telegrams 30a, 30b and 30c to the head end 4. The time stamps TS are not directly decompressed and/or evaluated in the head end 4, but rather are initially stored in storage device 50 of the head end 4. The consumption data are forwarded to the evaluation device 18 of the head end 4. If there is a requirement for the time stamps TS at a later time, the time stamps are decompressed and/or evaluated. For example, an alarm, a fault, interference or the like could be detected at one of the consumption meters 10a-10c. In FIG. 10, an alarm is detected at consumption meter 10b, for example. The head end 4 is able to decompress and/or evaluate the stored time stamps TS in the time stamp telegram 17b from the consumption meter 10b and to generate a raw measurement data stream 13b which is passed to the evaluation device 18. The detailed information provided by the raw measurement data stream 13b is used to analyse the behavior of the consumption meter 10b.

Figure 11:
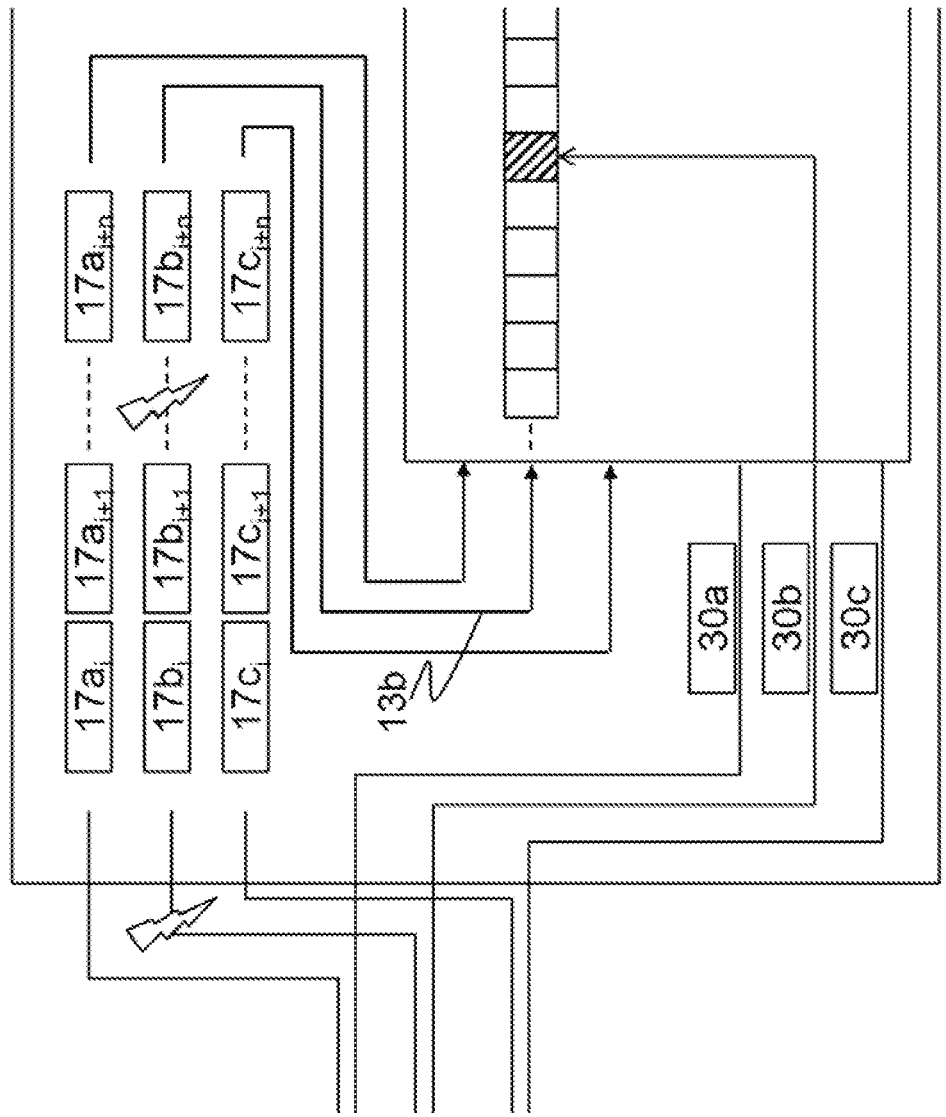
FIG. 11 is an illustration showing a compensation for the time stamps by means of consumption data in the head end.

In another configuration according to FIG. 11, the consumption data are used to supplement missing or incorrect time stamps TS. FIG. 11 shows, by way of example, three consumption meters 10a, 10b and 10c which each transmit time stamp telegrams 17a, 17b and 17c and consumption data telegrams 30a, 30b and 30c to the head end 4. For example, time stamp telegrams 17b from the consumption meter 10b are missing, which was caused, for example, by interference in the transmission from the consumption meter 10b to the head end 4. On account of the missing time stamps TS, the head end 4 cannot correctly evaluate the raw measurement data stream 13b in the evaluation device 18. The consumption data from the consumption data telegrams 30b from the consumption meter 10b can be used to identify the missing time stamps TS. Furthermore, the consumption data can be used to reset the consumption meter functions. New calculations can then be started proceeding from the current consumption data.

Figure 12:
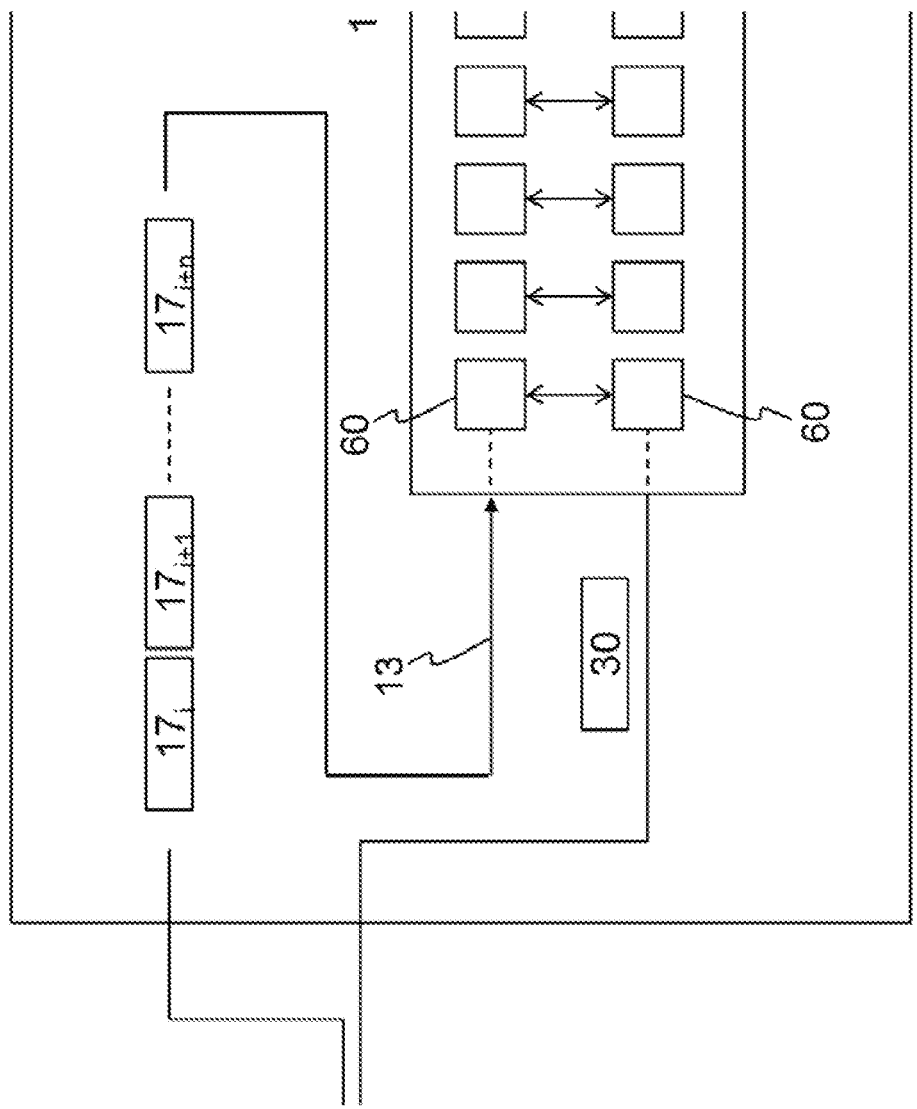
FIG. 12 is an illustration showing a consistency check of the data by comparing the time stamps with the consumption data in the head end.

The possibility of a configuration according to FIG. 12 also exists. This shows, by way of example, a consumption meter 10 which transmits time stamp telegrams 17 and consumption data telegrams 30 to the head end 4. In this case, the consumption data comprise an absolute meter index 60 at a particular time, for example an expiry date provided by the consumption meter 10. On the other hand, the time stamps TS are used in the head end 4 to calculate the absolute meter index 60 at a particular time, for example an expiry date provided by the head end 4. These two absolute meter indices 60 are used for a consistency check by comparing them. Both absolute meter indices 60 must be identical for a particular time. Otherwise, this indicates a discrepancy in the measuring methods, which is why correction measures have to be carried out.

With the method according to the invention, any desired raw measurement data can therefore be sampled and used as triggers for time stamps TS. The time stamps TS may be, in particular, times or time differences. A starting time is preferably defined.

The time stamps TS in the storage device 7 of the consumption meter 10 are preferably deleted only when the transmission of the time stamps TS via the primary communication path 5 has been confirmed by the receiver or data collector 3.

It goes without saying that a person skilled in the art understands that the invention can be applied to the measurement and remote reading of a wide variety of parameters and variables: it suffices to be able to accurately date an elementary change (which can be measured by the sensor 1) in a parameter or variable in accordance with the resolution of the sensor 1 in question (the time-stamped elementary variation can correspond to the resolution of the sensor or possibly a multiple of this resolution).

It goes without saying that the invention is not restricted to the embodiments described and illustrated in the accompanying drawings. Changes remain possible, in particular with respect to the provision of the various elements or by means of technical equivalents, without departing from the scope of protection of the invention. The subject matter of the disclosure also expressly includes combinations of partial features or subgroups of features.

LIST OF REFERENCE SIGNS

1 Sensor
2 Communication means
3 Data collector
4 Head end
5 Primary communication path
6 Tertiary communication path
7 Storage means
8 Microprocessor
9 Measuring element
10 Consumption meter
11 Radio path
13 Raw measurement data stream
14 Measurement data preparation means 15 Time reference device
16 Supply line
17 Time stamp telegram
18 Evaluation means
19 Pulse generator element
20 Impeller
30 Consumption data telegram
40 Mobile reading module
50 Storage means (head end)
60 Absolute meter index
PA$_j$ Data packet
TS Time stamp

The invention claimed is:

1. A method for collecting data during operation of at least one local sensor being part of a supply network intended to distribute a consumable, wherein the at least one local sensor containing a communication device, a storage device, and a measuring element providing elementary measuring units corresponding to at least one physical or physico-chemical variable or at least one physical or physico-chemical parameter, as raw measurement data, which comprises the steps of:
 generating consumption data from the elementary measuring units;
 determining conditions for generating time stamps in advance using a correlation model in order to determine a measurement resolution of the at least one local sensor;
 generating the time stamps of the raw measurement data in the at least one local sensor on a basis of the correlation model;
 transmitting the time stamps via a wired connection and/or via a radio path, with a result that the raw measurement data acquired by the measuring element are reconstructed and evaluated on a basis of the time stamps using the correlation model;
 transmitting, via a primary communication path, the consumption data in parallel with the time stamps, the at least one local sensor being connected to a data collector via the primary communication path;
 providing a tertiary communication path between the data collector and a head end;
 at least one of collecting, storing or evaluating the time stamps and/or the consumption data transmitted by the at least one local sensor and/or consumption meters in the data collector and/or the head end;
 transmitting the time stamps and the consumption data via different transmission paths or via different radio paths, a plurality of the time stamps being transmitted as a data packet along the primary communication path, the time stamps being compressed; and
 carrying out a new data transmission in a form of a message or a telegram as soon as a predefined quantity of the time stamps since a previous transmission has been reached.

2. The method according to claim 1, which further comprises packaging the time stamps by formatting them in data packets of a predetermined fixed size, wherein, each time an accumulated data reach a size of a data packet or a predefined interval of time has expired, a new transmission is initiated.

3. The method according to claim 1, which further comprises:
 determining a particular value, a particular value change or a particular value difference of the at least one physical or physico-chemical variable or the at least one physical or physico-chemical parameter within a scope of the correlation model for an assignment of a time stamp; and
 triggering and storing the time stamp in the storage device of the at least one local sensor if the particular value, the particular value change or the particular value difference is captured by the measuring element.

4. The method according to claim 1, wherein a gradually or incrementally increasing meter reading and/or a value table is/are represented by means of the time stamps within a scope of the correlation model.

5. The method according to claim 1, which further comprises providing the time stamps with a sign.

6. The method according to claim 1, wherein an elementary measuring unit of the elementary measuring units generates a time stamp as soon as the elementary measuring unit receives a pulse.

7. The method according to claim 1, wherein the compression of the time stamps is carried out in a loss-free manner.

8. The method according to claim 7, which further comprises storing compressed time stamps in a head end and the time stamps are decompressed as necessary.

9. The method according to claim 1, which further comprises carrying out a compression of the time stamps with a predefined permissible loss level.

10. The method according to claim 1, wherein the consumption data are not compressed.

11. The method according to claim 1, wherein the physical or chemico-physical parameters are characteristic of a quantity, quality and/or composition of a fluid which flows through the local sensor or with which contact is made by the latter.

12. The method according to claim 1, which further comprises transmitting the consumption data to a mobile reading module and transmitting the time stamps to a data collector via a primary communication path.

13. The method according to claim 1, which further comprises combining the consumption data and the time stamps.

14. The method according to claim 1, which further comprises carrying out a data transmission with redundancy.

15. The method according to claim 14, which further comprises achieving the redundancy in the data transmission by repeatedly transmitting same ones of the time stamps and/or repeatedly transmitting a same data packet in a plurality of successive transmission operations.

16. The method according to claim 1, which further comprises comparing the consumption data and the time stamps in order to carry out a consistency check.

17. The method according to claim 1, which further comprises using the consumption data to compensate for missing and/or incorrect time stamps.

18. The method according to claim 1, wherein the elementary measuring units are electrical voltage or current intensity.

19. The method according to claim 1, wherein a measured physical variable relates to a supply medium.

20. The method according to claim 1, which further comprises generating a raw measurement data stream on a basis of the time stamps arriving at the data collector and/or at the head end using the correlation model.

21. The method according to claim 20, which further comprises evaluating the raw measurement data stream in a further course of data processing, on a time-historical basis without a time gap irrespective of the measurement resolution of the local sensor.

22. The method according to claim 20, wherein the raw measurement data stream has a temporal resolution which is determined or conditioned by a sensor sampling rate or measuring element sampling rate or a multiple thereof.

23. The method according to claim 20, wherein the raw measurement data stream is continuous and/or complete taking a continuous temporal resolution as a basis.

24. A measurement data information network, comprising:
   a head end; and
   at least one local sensor for generating and/or forwarding time stamps of raw measurement data on a basis of a correlation model, measured values from the raw measurement data are evaluated in said head end, said at least one local sensor configured to operated in accordance with the method according to claim 1.

25. The measurement data information network according to claim 24, further comprising at least one data collector configured to perform the method according to claim 1.

26. The measurement data information network according to claim 24, wherein a raw measurement data stream to be evaluated in said head end is continuous and/or complete taking a continuous temporal resolution as a basis.

27. A data collector configured to perform the method according to claim 1.

28. A sensor configured to perform the method according to claim 1.

* * * * *